United States Patent
Cai et al.

(10) Patent No.: US 10,580,378 B2
(45) Date of Patent: Mar. 3, 2020

(54) SHIFT REGISTER, GATE DRIVE CIRCUIT AND DISPLAY PANEL

(71) Applicant: XIAMEN TIANMA MICRO-ELECTRONICS CO., LTD., Xiamen (CN)

(72) Inventors: Shoujin Cai, Xiamen (CN); Bingping Liu, Xiamen (CN); Yihua Zhu, Xiamen (CN); Yuanhang Li, Xiamen (CN); Xiaoxiao Wu, Xiamen (CN); Guozhao Chen, Xiamen (CN); Junyi Li, Xiamen (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 178 days.

(21) Appl. No.: 15/793,697

(22) Filed: Oct. 25, 2017

(65) Prior Publication Data
US 2018/0047360 A1    Feb. 15, 2018

(30) Foreign Application Priority Data
May 16, 2017    (CN) .......................... 2017 1 0343024

(51) Int. Cl.
*G11C 19/00* (2006.01)
*G09G 3/36* (2006.01)
*G11C 19/28* (2006.01)
*G09G 3/20* (2006.01)

(52) U.S. Cl.
CPC ............. *G09G 3/3677* (2013.01); *G09G 3/20* (2013.01); *G09G 3/2096* (2013.01); *G11C 19/28* (2013.01); *G11C 19/287* (2013.01); *G09G 2300/0426* (2013.01); *G09G 2310/0281* (2013.01); *G09G 2310/0286* (2013.01); *G09G 2310/0289* (2013.01); *G09G 2310/0291* (2013.01); *G09G 2310/08* (2013.01); *G09G 2320/0219* (2013.01); *G09G 2320/0247* (2013.01)

(58) Field of Classification Search
None
See application file for complete search history.

(56) References Cited

U.S. PATENT DOCUMENTS

| | | | |
|---|---|---|---|
| 2015/0248867 A1* | 9/2015 | Tan | G09G 3/3648 345/100 |
| 2017/0263203 A1* | 9/2017 | Zhao | G09G 3/3677 |
| 2018/0151139 A1* | 5/2018 | Yi | G11C 19/28 |
| 2018/0158425 A1* | 6/2018 | Gong | G09G 3/3266 |
| 2018/0166039 A1* | 6/2018 | Gong | G11C 19/28 |
| 2018/0218701 A1* | 8/2018 | Yi | G09G 3/3677 |

\* cited by examiner

*Primary Examiner* — Tuan T Lam
(74) *Attorney, Agent, or Firm* — Alston & Bird LLP

(57) ABSTRACT

A shift register, gate drive circuit and display panel are provided. The shift register includes a latch unit, a NAND gate unit, a buffer unit and a switch unit. The latch unit, the NAND gate unit and the buffer unit are configured to produce a scanning driving signal and a scanning stopping signal. The latch unit is configured to control the switch unit to be turned on so as to output the scanning driving signal or the scanning stopping signal from the output terminal of the shift register, or control the switch unit to be turned off so as to enable the output terminal of the shift register to float.

14 Claims, 12 Drawing Sheets

SHIFT REGISTER, GATE DRIVE CIRCUIT AND DISPLAY PANEL

CROSS-REFERENCE TO RELATED APPLICATION

This application claims priority to Chinese patent application No. CN201710343024.0, filed on May 16, 2017, which is incorporated by reference herein in its entirety.

TECHNICAL FIELD

The embodiments of the present disclosure relate to the display technology, and, in particular, to a shift register, gate drive circuit of a display panel.

BACKGROUND

The drive frequency of an existing display panel is generally set at 60 Hz. That is, 60 frames are scanned within 1 second and the scanning time of each frame is 16.67 ms. Therefore, a frame time is 16.67 ms, and data is written every 16.67 ms for any line of pixels. For example, with respect to an existing Full High Definition (FHD) display panel, within a frame of time, one scanning line is turned on for 1.5 μs. At this moment, pixel switches in the pixels are turned on and signals can be written to the pixel electrodes of the pixels, and then voltages of the pixel electrodes are held by storage capacitors in the pixels for 16.67 ms until signals of the pixel electrodes are refreshed in the next frame.

The higher the drive frequency of the display panel is, the greater the power consumption becomes. Apparently, the power consumption of the display panel can be reduced by reducing the drive frequency of the display panel. In order to ensure the display quality of the display panel, the drive frequency of the display panel is generally reduced to 30 Hz or 15 Hz.

However, flickers will be aggravated if the drive frequency is reduced below 30 HZ.

SUMMARY

The embodiments of the present disclosure provide a shift register, gate drive circuit and display panel to overcome serious flickers on the display panel caused by reducing the drive frequency.

In a first aspect, an embodiment of the present disclosure provides a shift register including a latch unit, a NAND gate unit and a buffer unit.

The latch unit has an input terminal for receiving a shift register signal, a clock signal terminal electrically connected to a first clock signal line, and an output terminal electrically connected to an input terminal of the NAND gate unit and an input terminal of a lower-level shift register separately; the NAND gate unit has a clock signal terminal electrically connected to a second clock signal line, and an output terminal electrically connected to an input terminal of the buffer unit; an output terminal of the buffer unit is electrically connected to an output terminal of the shift register, the latch unit, the NAND gate unit and the buffer unit are configured to produce a scanning driving signal and a scanning stopping signal.

The shift register further includes a switch unit, the output terminal of the latch unit is further electrically connected to a control terminal of the switch unit, the latch unit is configured to perform one of the following operations: controlling the switch unit to be turned on so as to output the scanning driving signal or the scanning stopping signal from the output terminal of the shift register, and controlling the switch unit to be turned off to enable the output terminal of the shift register to float.

In a first period, the switch unit is turned on so as to output the scanning driving signal from the shift register; in a second period, the switch unit is turned on to output the scanning stopping signal from the shift register; and in a third period, the switch unit is turned off so as to enable the output terminal of the shift register to float.

In a second aspect, an embodiment of the present disclosure further provides a gate drive circuit including n-level cascaded shift registers mentioned above and n scanning lines, where n is a positive integer.

An input terminal of a latch unit in a mth-level shift register is electrically connected to an output terminal of a latch unit in a (m−1)th-level shift register, where m=1, 2, . . . , n, and an input terminal of a latch unit in a first-level shift register is configured to receive a start signal when m=1.

The mth-level shift register is electrically connected to a mth scanning line, and is configured to apply a scanning driving signal to the mth scanning line in a first period, apply a scanning stopping signal to the mth scanning line in a second period, and control the output terminal of the shift register to float in a third period so as to enable an electric potential of the mth scanning line to float.

In a third aspect, an embodiment of the present disclosure further provides a display panel including the above-mentioned gate drive circuit.

The shift register provided by the embodiments of the present disclosure has a work timing sequence composed of a first period, a second period and a third period within one frame of time. In the second period, the pixel switch is controlled to be turned off by the shift register, a leakage current may exist and cause the voltage of the pixel electrode to drop. However, in the third period, the output terminal of the shift register floats to control the gate of the pixel switch to float, so the drain of the pixel switch does not discharge via capacitance formed between the gate and the channel, thereby preventing the voltage of the pixel electrode from dropping for a long time within a frame of time. Therefore, the shift register provided by the embodiments of the present disclosure reduces a leakage current, reduces flickers on the display panel, especially serious flickers on an existing display panel at a low frequency, and solves the serious flicker problem caused by decreasing the drive frequency of the display panel.

BRIEF DESCRIPTION OF DRAWINGS

To illustrate technical solutions of the embodiments of the present disclosure or of the related art more clearly, the accompanying drawings used in description of the embodiments or the related art will be briefly described below. Apparently, the accompanying drawings described below illustrate only part of the embodiments of the present disclosure, and those skilled in the art may obtain other appended drawings based on the appended drawings described below without paying any creative work.

DETAILED DESCRIPTION

The technical solutions of the present disclosure will be described clearly and completely with reference to the accompanying drawings through the embodiments from which the object, technical solutions and advantages of the present disclosure will be apparent. Apparently, the embodiments described below are part, not all, of the embodiments of the present disclosure. On the basis of the embodiments described herein, all other embodiments obtained by those skilled in the art without paying any creative labor are within the scope of the present disclosure.

The drive frequency of an existing display panel is generally 60 Hz. The higher the drive frequency of the display panel is, the greater the power consumption becomes. On the premise that the display quality of the display panel is assured as much as possible, the drive frequency of the display panel is generally reduced to 30 Hz or 15 Hz to reduce the power consumption of the display panel. A decrease in the drive frequency of the display panel means a decrease in a refresh rate of signals for the pixel electrodes of pixels. However, a leakage current exists in the pixel switches of the pixels. The leakage current in the pixel switches in addition to the decrease in the refresh rate of the signals for the pixel electrodes aggravates flickers on the display panel.

Figure 1A:
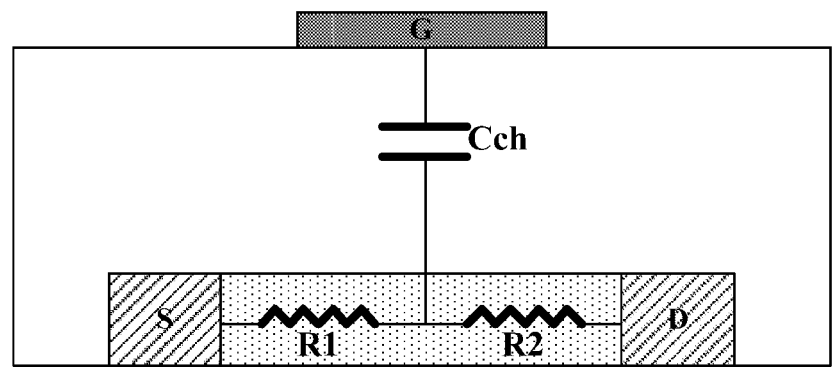
FIG. 1A is an equivalent circuit diagram illustrating a pixel switch of an existing display panel.
Figure 1B:
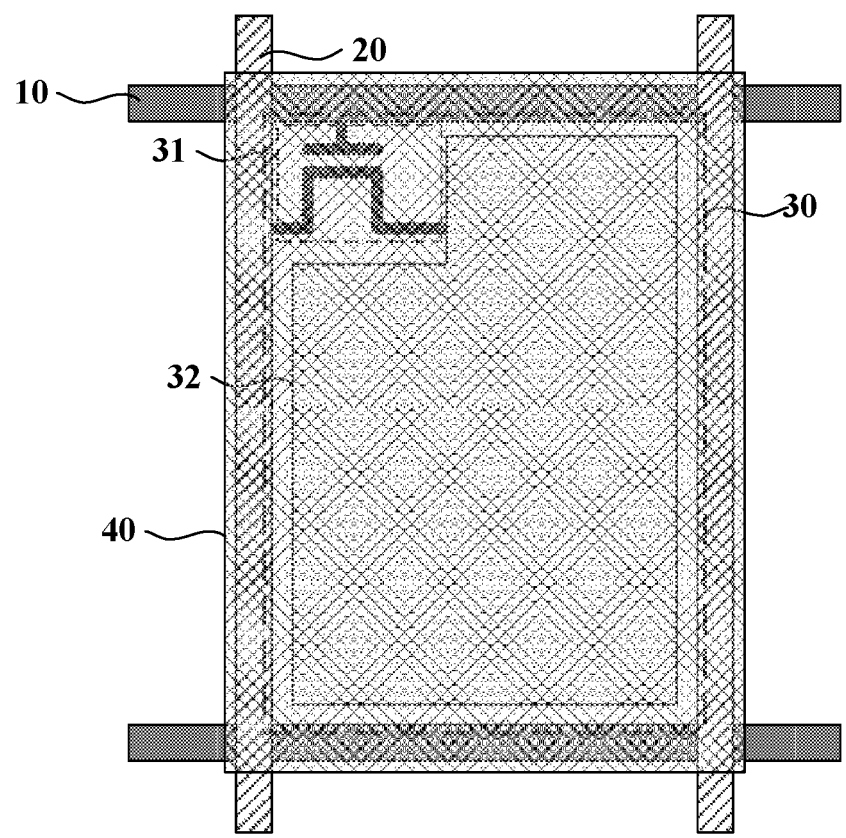
FIG. 1B is a schematic diagram illustrating a pixel of the existing display panel.

FIG. 1A is an equivalent circuit diagram illustrating a pixel switch of an existing display panel. FIG. 1B is a diagram of a pixel illustrating the existing display panel. The display panel includes a plurality of scanning lines 10, a plurality of data lines 20 and a common electrode 40. The plurality of scanning lines 10 and the plurality of data lines 20 intersect to define a plurality of pixels 30, and only one of the plurality of pixels 30 is illustrated herein. Each pixel 30 includes a pixel electrode 32 and a pixel switch 31 having a gate G, a source S and a drain D. The gate G is electrically connected to the scanning line 10, the source S is electrically connected to the data line 20, and the drain D is electrically connected to the pixel electrode 32. The pixel electrode 32 and the common electrode 40 are overlapped to form a storage capacitor. If a scanning driving signal is output from the scanning line 10 to turn on the pixel switch 31, a data voltage signal is written to the pixel electrode 32 via the data line 20. The pixel switch 31 is turned off when a scanning stopping signal is output from the scanning line 10. At this moment, the scanning line 10 is in a holding state, i.e., the voltage of the pixel electrode 32 is held by the storage capacitor until the signal of the pixel electrode 32 is refreshed when the pixel switch 31 is controlled to be turned on by the scanning line 10 in the next frame.

The gate G, the source S and the drain D of the pixel switch 31 may be equivalent to resistance R1 between the source S and a channel in the pixel switch 31, resistance R2 between the drain D and the channel, and capacitance Cch between the channel and the gate G In the case that the pixel switch 31 is an NMOS transistor, the scanning driving signal is higher than a threshold voltage of the NMOS transistor while the scanning stopping signal is lower than the threshold voltage of the NMOS transistor. When the scanning driving signal is output from the scanning line 10, a high level signal is received by the gate G of the pixel switch 31 to enable the pixel switch 31 to be turned on, so that the pixel electrode 32 is charged by the data line 20 through the pixel switch 31. When the scanning stopping signal is output from the scanning line 10, a low level signal is received by the gate G of the pixel switch 31 to enable the pixel switch 31 to be turned off. At this moment, the scanning line 10 is in the holding state, the potential of the gate G of the pixel switch 31 is equal to that of the scanning stopping signal from the scanning line 10, and the potential of the drain D of the pixel switch 31 is equal to that of the pixel voltage signal on the pixel electrode 32.

A discharge path is formed by the drain D of the pixel switch 31, the resistance R2, the gate G and the scanning line 10 when the pixel switch 31 is turned off. This is because the potential of the drain D of the pixel switch 31 is larger than that of the gate G of the pixel switch 31 at this time and the capacitance Cch is formed between the gate G and the channel. In other words, the drain D of the pixel switch 31 discharges via the resistance R2 and the capacitance Cch. Therefore, a leakage current exists in the drain D of the pixel switch 31.

However, since the drain D of the pixel switch 31 is electrically connected to the pixel electrode 32, the voltage of the pixel electrode 32 drops due to the leakage current in the pixel switch 31, thereby causing an offset of gray scale and thus resulting in flickers. A decrease in the drive frequency causes an increase in the frame of time, i.e., an interval at which data is written for any line of pixels is extended, which means that the refresh rate of the signals for the pixel electrode 32 is lowered, and the time period during which the pixel switch 31 is turned off is prolonged. However, the longer the time period during which the pixel switch 31 is continuously turned off is, the greater the discharge capacity, via the capacitance Cch, of the drain D of the pixel switch 31 becomes, and thus the more the voltage drop of the pixel electrode 32 becomes. That is, the difference between the voltage initially written to the pixel electrode 32 and the voltage of the pixel electrode 32 before being refreshed increases, causing a change in brightness of the pixel electrode 32 during one frame of time to increase. Thus, at the low drive frequency, the display panel undergoes serious flickers.

Figure 2A:
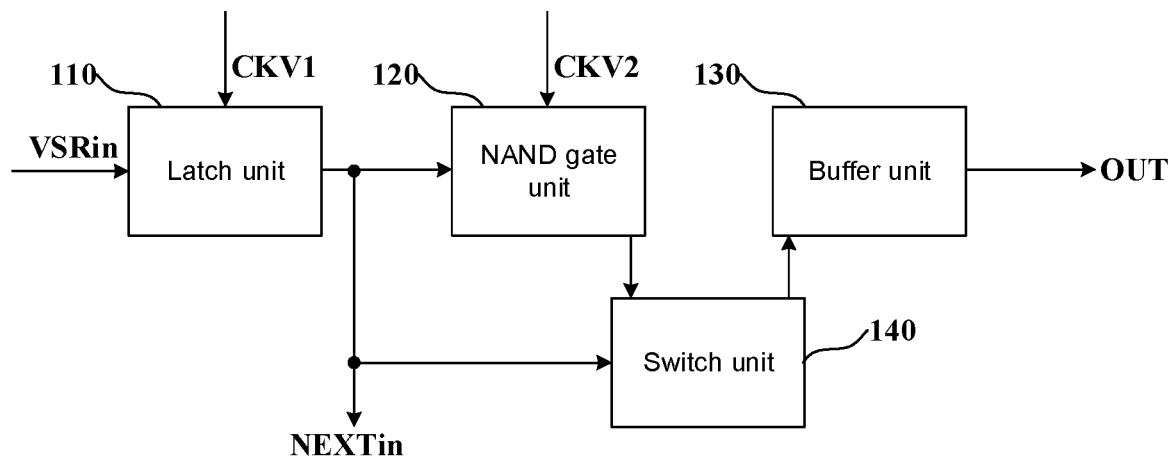
FIG. 2A is a block diagram illustrating a shift register according to an embodiment of the present disclosure.

FIG. 2A is a block diagram illustrating a shift register according to an embodiment of the present disclosure. The shift register provided by the present embodiment is applicable to a gate drive circuit for a display panel. The shift register provided by the present embodiment includes a latch unit 110, a NAND gate unit 120 and a buffer unit 130. The latch unit 110 has an input terminal for receiving a shift register signal VSRin, a clock signal terminal electrically connected to a first clock signal line CKV1, and an output terminal electrically connected to an input terminal of the NAND gate unit 120 and an input terminal NEXTin of a lower-level shift register separately. The NAND gate unit 120 has a clock signal terminal electrically connected to a second clock signal line CKV2, and an output terminal electrically connected to an input terminal of the buffer unit 130. The buffer unit 130 has an output terminal electrically connected to an output terminal OUT of the shift register. The latch unit 110, the NAND gate unit 120 and the buffer unit 130 are configured to produce the scanning driving signal and the scanning stopping signal. The shift register further includes a switch unit 140. The output terminal of the latch unit 110 is further electrically connected to a control terminal of the switch unit 140. The latch unit 110 is configured to control the switch unit 140 to be turned on so as to output the scanning driving signal or the scanning stopping signal from the output terminal OUT of the shift register, or control the switch unit 140 to be turned off so as to enable the output terminal OUT of the shift register to float. In a first period, the switch unit 140 is turned on so as to output the scanning driving signal from the shift register. In a second period, the switch unit 140 is turned on so as to output the scanning stopping signal from the shift register. In a third period, the switch unit 140 is turned off so as to enable the output terminal of the shift register to float.

Optionally, in the present embodiment, the latch unit 110 is configured to control the switch unit 140 to be turned on or off so that a transmission path between the NAND gate unit 120 and the buffer unit 130 is connected or disconnected. Optionally, the output terminal of the NAND unit 120 is electrically connected to the input terminal of the buffer unit 130 via the switch unit 140. Specifically, the output terminal of the NAND unit 120 is electrically connected to the input terminal of the switch unit 140, and the input terminal of the buffer unit 130 is electrically connected to the output terminal of the switch unit 140. Accordingly, when the switch unit 140 is turned on, the output terminal OUT of the shift register outputs the scanning driving signal or the scanning stopping signal. When the switch unit 140 is turned off, the output terminal OUT of the shift register floats.

Figure 2B:
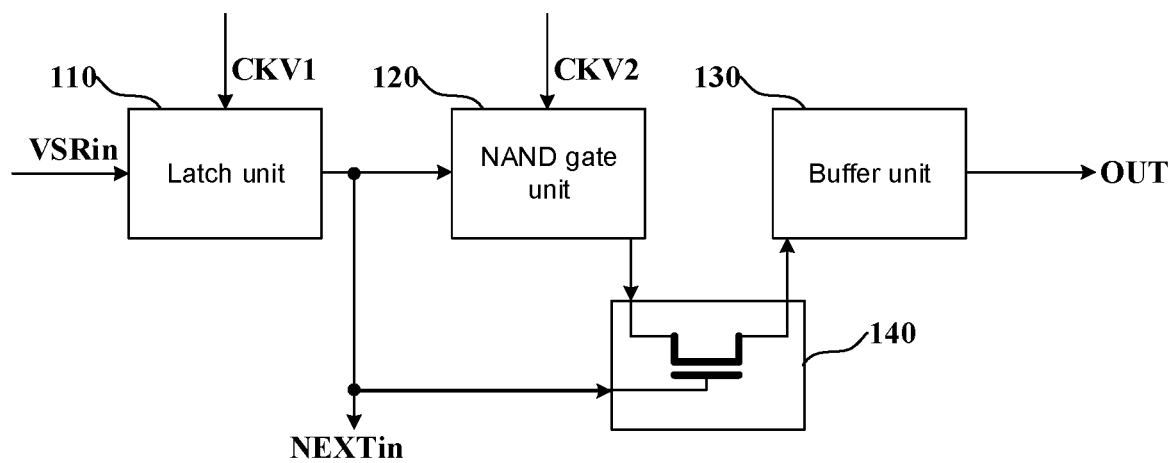
FIG. 2B is a block diagram illustrating another structure of the shift register according to an embodiment of the present disclosure.

Exemplarily and optionally, as illustrated in FIG. 2B, the switch unit 140 includes a first NMOS transistor. The gate of the first NMOS transistor is electrically connected to the output terminal of the latch unit 110. In the first period, the output terminal of the latch unit 110 outputs a high level signal to enable the switch unit 140 to be turned on so as to output the scanning driving signal from the output terminal OUT of the shift register. In the second period, the output terminal of the latch unit 110 outputs a high level signal to enable the switch unit 140 to be turned on so as to output the scanning stopping signal from the output terminal OUT of the shift register. In the third period, the output terminal of the latch unit 110 outputs a low level signal to enable the switch unit 140 to be turned off so as to enable the output terminal OUT of the shift register to float. Optionally, the first NMOS transistor has a double-gate structure. Specifically, the width-to-length ratio W/L of the first NMOS transistor is in a range of [2.5, 7.5] and the width of the first NMOS transistor is in a range of [20 μm, 60 μm]. In other words, the W/L of the first NMOS transistor is optionally in a range of 20 μm/(4+4) μm~60 μm/(4+4) μm. One of the gates in the double-gate transistor is AC-grounded. The other gate and the drain can effectively achieve a function of electrostatic shielding so that capacitance between the gate and the drain is greatly reduced. As for the shift register provided by the present embodiment, the double-gate transistor is adopted as the switch unit 140, so that the leakage current can be further reduced.

The larger the width-to-length ratio of the transistor is, the stronger the driving ability of the transistor becomes, the better the turn-off can be kept and the smaller the leakage current of the transistor becomes. The smaller the width-to-length ratio of the transistor is, the weaker the driving ability of the transistor becomes, the worse the turn-off can be kept and the larger the leakage current of the transistor becomes. In the present embodiment, the switch unit 140 includes the first NMOS transistor. When the first NMOS transistor is turned off, the scanning line floats. If the turn-off effect of the first NMOS transistor is good, the floating effect of the scanning line is good and the leakage current of the pixel switch is reduced. If the turn-off effect of the first NMOS transistor is poor, the floating effect of the scanning line is poor, causing the pixel switch to have a large leakage current. Specifically, when the width-to-length ratio of the first NMOS transistor exceeds 7.5, the turn-off effect of the first NMOS transistor no longer increases significantly. Meanwhile, the higher the width-to-length ratio is, the larger area the first NMOS transistor occupies. Therefore, the width-to-length ratio of the first NMOS transistor is selected to be less than or equal to 7.5 in the present embodiment. When the width-to-length ratio of the first NMOS transistor is less than 2.5, the turn-off effect of the first NMOS transistor is poor and the leakage current is large, thereby causing the scanning line to have a poor floating effect and the pixel switch to have a large leakage current. Therefore, the width-to-length ratio of the first NMOS transistor is selected to be greater than or equal to 2.5 in the present embodiment.

It will be understood by those skilled in the art that in other alternative embodiments, the switch unit may use another structure. For example, the switch unit includes an inverter and a PMOS transistor connected in series. The structure of the switch unit is not restricted in the present disclosure, and any circuit structure capable of providing the functions of the switch unit described in the present embodiment falls within the scope of the present disclosure. It will also be understood by those skilled in the art that the width-to-length ratio and structure of the first NMOS transistor are not limited to the above embodiment, the parameters and structure of the first NMOS transistor are not restricted to in the present disclosure, and any transistor capable of providing the functions of the switch unit described in the present embodiment falls within the scope of the present disclosure.

Figure 2C:
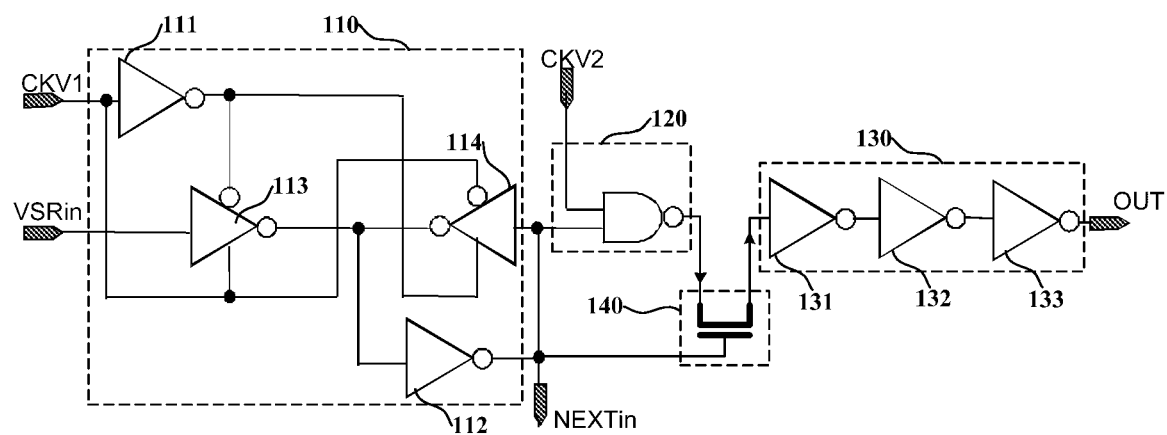
FIG. 2C is a schematic diagram illustrating a circuit structure of the shift register according to an embodiment of the present disclosure.

On the basis of the above-mentioned technical solution, exemplarily and optionally, the latch unit 110 in the shift register includes a fourth inverter 111, a fifth inverter 112, a first clock inverter 113 and a second clock inverter 114, as illustrated in FIG. 2C. The fourth inverter 111 has an input terminal electrically connected to the first clock signal line CKV1, and an output terminal electrically connected to a clock input terminal of the first clock inverter 113 and a control terminal of the second clock inverter 114 separately. The first clock inverter 113 has an input terminal for receiving the shift register signal VSRin, an output terminal electrically connected to an input terminal of the fifth inverter 112, and a control terminal electrically connected to the first clock signal line CKV1. The second clock inverter 114 has an input terminal electrically connected to an output terminal of the fifth inverter 112, a clock input terminal electrically connected to the first clock signal line CKV1, and an output terminal electrically connected to an input terminal of the fifth inverter 112. The output terminal of the fifth inverter 112 is also electrically connected to the input terminal of the NAND gate unit 120, the control terminal of the switch unit 140 and the input terminal NEXTin of the lower-level shift register. Optionally, the NAND gate unit 120 includes a NAND gate circuit. The first input terminal of the NAND gate circuit is electrically connected to a second clock signal line CKV2, the second input terminal of the NAND gate circuit is electrically connected to the output terminal of the latch unit 110, and the output terminal of the NAND gate circuit is electrically connected to the input terminal of the switch unit 140. The first clock signal line CKV1 outputs a first clock signal, and the second clock signal line CKV2 outputs a second clock signal. The first clock signal and the second clock signal are both pulse signals. The buffer unit 130 includes a first inverter 131, a second inverter 132 and a third inverter 133. The input terminal of the first inverter 131 is electrically connected to the output terminal of the switch unit 140, and the output terminal of the first inverter 131 is electrically connected to the input terminal of the second inverter 132. The input terminal of the third inverter 133 is electrically connected to the output terminal of the second inverter 132, and the output terminal of the third inverter 133 is served as the output terminal OUT of the shift register.

It will be understood by those skilled in the art that the structures of the latch unit, the switch unit and the buffer unit described in the above embodiment are only an example of the present disclosure. The latch unit, the switch unit and the buffer unit shown in the present disclosure include but are not limited to the above-mentioned structure. The structures of the latch unit, the switch unit and the buffer unit are not restricted in the present disclosure, and any structure of a latch unit, a switch unit and a buffer unit capable of providing the functions of the shift register of the present disclosure falls within the scope of the present disclosure.

Figure 2D:
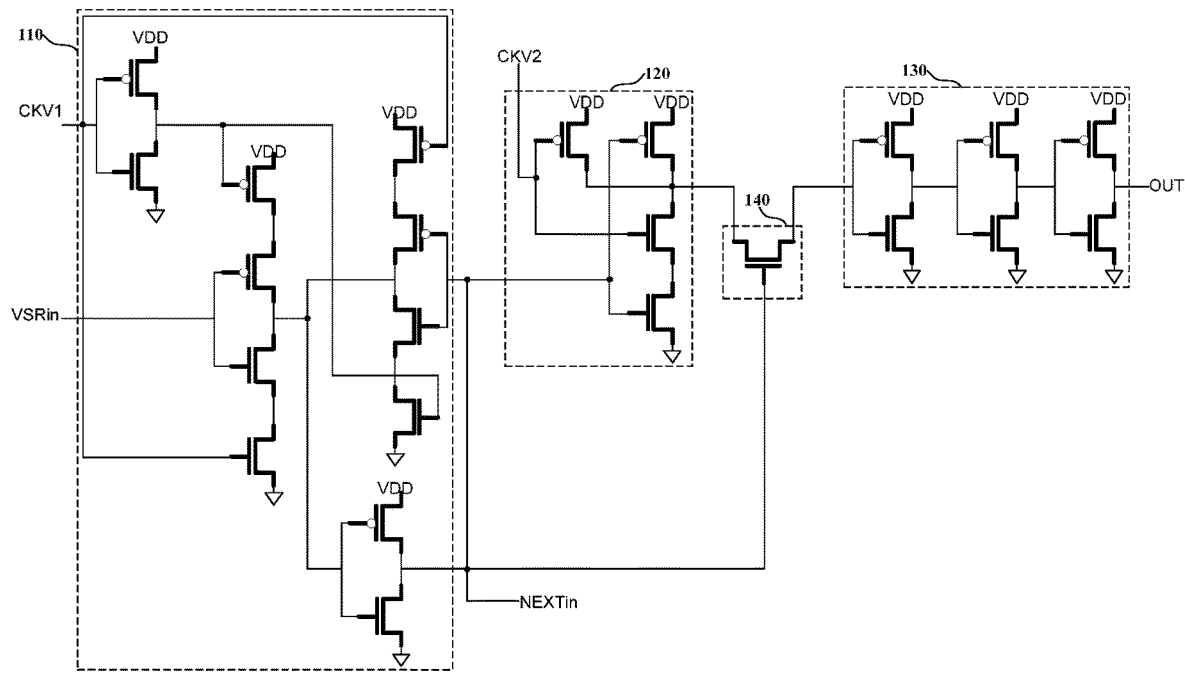
FIG. 2D is a schematic diagram illustrating yet another circuit structure of the shift register according to an embodiment of the present disclosure.

Specifically and optionally, in the present embodiment, the latch unit 110, the NAND gate unit 120, the buffer unit 130 and the switch unit 140 may adopt structures as illustrated in FIG. 2D. The latch unit 110 is configured to latch a signal and shift the signal. The latch unit 110 is further configured to output the NEXTin signal. The latch unit 110, the NAND gate unit 120 and the buffer unit 130 are configured to output the scanning driving signal and the scanning stopping signal. When the switch unit 140 is turned on or off under the control of the latch unit 110, the transmission path between the NAND unit 120 and the buffer unit 130 is connected or disconnected accordingly. Accordingly, the output terminal OUT of the shift register sequentially outputs the scanning driving signal and the scanning stopping signal in the first period and the second period, and floats in the third period so that the scanning line is in the floating state. It is to be noted that the structure of the latch unit 110, the NAND gate unit 120 and the buffer unit 130 shown in FIG. 2D is merely an exemplary structure and does not constitute a limitation on the specific structure of the shift register.

The shift register provided by the present embodiment may be served as a lower-level shift register to receive the shift register signal VSRin output from the higher-level shift register. The shift register provided by the present embodiment may further be served as a primary shift register, and be electrically connected to a driver chip of the display panel to receive the shift register signal VSRin output from the driver chip. The position of the shift register of the present embodiment in the cascade circuit is not limited in the present disclosure. The shift register provided by the present embodiment operates under the control of the first clock signal line CKV1, the second clock signal line CKV2 and the shift register signal VSRin. The driver chip (not illustrated) is electrically connected to the first clock signal line CKV1 and the second clock signal line CKV2 separately. The shift register further includes an output terminal OUT electrically connected to the scanning line of the display panel to apply a signal to the scanning line. The shift register further includes an output terminal electrically connected to the input terminal NEXTin of the lower-level shift register, which is omitted when the shift register is served as a final-level shift register, to trigger the lower-level shift register.

In the present embodiment, the input terminal of the latch unit 110 in the shift register is served as the input terminal of the shift register to receive the shift register signal VSRin. The clock signal terminal of the latch unit 110 is electrically connected to the first clock signal line CKV1 to receive the first clock signal. The output terminal of the latch unit 110 is electrically connected to the input terminal of the NAND gate unit 120 and the control terminal of the switch unit 140 separately. Moreover, the output terminal of the latch unit 110 is also served as a triggering terminal electrically connected to the input terminal NEXTin of the lower-level shift register. The clock signal terminal of the NAND gate unit 120 is electrically connected to the second clock signal line CKV2 to receive the second clock signal. The output terminal of the NAND gate unit 120 is electrically connected to the input terminal of the buffer unit 130 via the switch unit 140. The output terminal of the buffer unit 130 is served as the output terminal OUT of the shift register, and is electrically connected to a corresponding scanning line.

It is to be noted that, when applied to a display panel, the shift register of the present embodiment is electrically connected to a corresponding scanning line to control the pixel switches of a line of pixels to be turned on or off. Based on this, the work timing sequence of the shift register of the present embodiment within one frame of time is divided into three periods: a first period, a second period and a third period. In the first period, the switch unit 140 of the shift register is turned on to enable the shift register to output the scanning driving signal. A corresponding scanning line electrically connected to this shift register obtains the scanning driving signal, and controls the pixel switches of a line of pixels corresponding to the scanning line to be turned on so as to display through this line of pixels. In the second period, the switch unit 140 of the shift register is turned on to enable the shift register to output the scanning stopping signal. The corresponding scanning line electrically connected to this shift register obtains the scanning stopping signal, and controls the pixel switches of the line of pixels corresponding to the scanning line to be turned off so that the storage capacitors for this line of pixels hold the voltages of the pixel electrodes, i.e., the scanning line is in a holding state. In the third period, the switch unit 140 of the shift register is turned off to enable the output terminal of the shift register to float. The corresponding scanning line electrically connected to this shift register is in a state of open circuit, i.e., the scanning line is in a floating state. In this case, the storage capacitors in this line of pixels continue holding the voltages of the pixel electrodes.

In the present embodiment, the operation principles of the shift register in the first period and in the second period are as follows. In the first period, the shift register outputs the scanning driving signal, i.e., the shift register applies the scanning driving signal to the scanning line. When the gates of the pixel switches electrically connected to the scanning line receive the scanning driving signal, these pixel switches are turned on so that a data voltage signal is transmitted, through the pixel switches in the on-state, to the pixel electrodes electrically connected to the drains of these pixel switches from the data line electrically connected to the sources of these pixel switches. In this way, the pixel electrodes are charged. In the second period, the shift register outputs the scanning stopping signal, i.e., the shift register applies the scanning stopping signal to the scanning line. When the gates of the pixel switches receive the scanning stopping signal, these pixel switches are turned off and the storage capacitors hold the voltages of the pixel electrodes.

The operation process in the third period of the shift register provided by the present embodiment will be described below with reference to the equivalent circuit diagram of the pixel switch illustrated in FIG. 1A. Specifically, in the second period, the shift register outputs the scanning stopping signal via the scanning line, and then the gate of the pixel switch receives the scanning stopping signal so that the pixel switch is turned off. In the third period, the output terminal of the shift register floats, and the scanning line is in the floating state. That is, the scanning line does not output a signal. Therefore, the pixel switch remains the off-state and the gate of the pixel switch floats. As can be seen from the above description, in the pixel switch, capacitance Cch is formed between the gate and the channel, and resistance R2 is formed between the drain and the channel. When the gate of the pixel switch is in the floating state in the third period, one electrode of the capacitance Cch, i.e., the gate G is disconnected. Thus, no discharge path is formed by the drain D, the resistance R2, the capacitance Cch and the gate G. Accordingly, the drain D does not discharge through the resistance R2 and the capacitance Cch. In other words, no leakage current is produced in the drain of the pixel switch during the third period. Accordingly, the voltage of the pixel electrode electrically connected to the drain will not drop.

In the related art, after the pixel switch is turned off, the voltage of the pixel electrode drops continuously due to a continuous leakage current until the next data writing. As a result, the voltage of the pixel electrode drops dramatically within one frame of time and the brightness changes dramatically. In the present embodiment, the pixel switch is controlled by the shift register to be turned off in the second period and the third period. In the third period, the output terminal of the shift register floats so as to control the gate of the pixel switch to float, and thus no leakage current exists in the drain of the pixel switch and the voltage of the pixel electrode will not drop. Since the voltage of the pixel electrode drops only in the second period, the voltage of the pixel switch drops slightly within one frame of time. Accordingly, the brightness of the pixel electrode changes slightly within one frame of time. Based on this, the shift register provided by the present embodiment reduces the leakage current and reduces flickers on the display panel. When the drive frequency of the display panel is decreased, serious flickers will not occur because the voltage of the pixel electrode drops slightly within one frame of time and the brightness decreases slightly. That is, the present embodiment solves the serious flicker problem caused by decreasing the drive frequency of the display panel.

Figure 3:
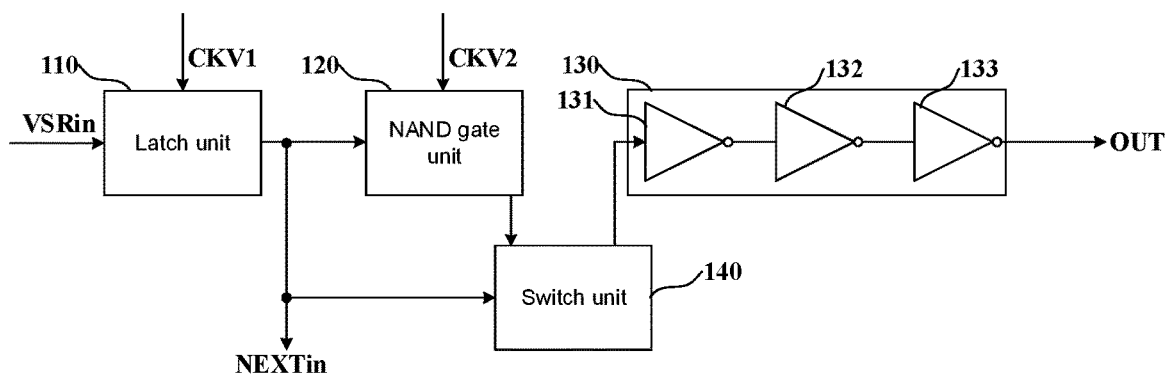
FIG. 3 is a block diagram illustrating a shift register according to an embodiment of the present disclosure.

Exemplarily, an embodiment of the present disclosure further provides a shift register on the basis of the above-mentioned technical solution. As illustrated in FIG. 3, the buffer unit 130 of the shift register includes a first inverter 131, a second inverter 132 and a third inverter 133. The input terminal of the first inverter 131 is electrically connected to the output terminal of the switch unit 140, and the output terminal of the first inverter 131 is electrically connected to the input terminal of the second inverter 132. The input terminal of the third inverter 133 is electrically connected to the output terminal of the second inverter 132, and the output terminal of the third inverter 133 is served as the output terminal OUT of the shift register.

In the shift register illustrated in FIG. 3, the control terminal of the switch unit 140 is electrically connected to the output terminal of the latch unit 110, the input terminal of the switch unit 140 is electrically connected to the output terminal of the NAND gate unit 120, and the output terminal of the switch unit 140 is electrically connected to the input terminal of the first inverter 131. The switch unit 140 is controlled to be turned on or off by the latch unit 110 so that the transmission path between the NAND gate unit 120 and the buffer unit 130 can be connected or disconnected. When the switch unit 140 is controlled to be turned on by the latch unit 110, the signal output from the NAND gate unit 120 can be transmitted to the buffer unit 130 through the switch unit 140 so as to output the signal from the output terminal of the buffer unit 130. When the switch unit 140 is controlled to be turned off by the latch unit 110, the signal output from the NAND gate unit 120 fails to be transmitted to the buffer unit 130, and the output terminal of the buffer unit 130 floats. Accordingly, the scanning line is in the floating state and no signal is transmitted.

The output terminal OUT of the shift register illustrated in FIG. 3 floats in the third period so that the gate of the pixel switch floats. Therefore, no leakage current exists in the drain of the pixel switch and the voltage of the pixel electrode will not drop. As a result, the voltage of the pixel switch drops slightly within one frame of time. Accordingly, the brightness of the pixel electrode decreases slightly within one frame of time. Based on this, the shift register provided by the present embodiment reduces the leakage current and reduces flickers on the display panel. When the drive frequency of the display panel is decreased, serious flickers will not occur because the voltage of the pixel electrode drops slightly within one frame of time and the brightness decreases slightly. That is, the present embodiment solves the serious flicker problem caused by decreasing the drive frequency of the display panel.

It will be understood by those skilled in the art that the structure of the buffer unit in the shift register provided by the present disclosure includes, but is not limited to, the above-mentioned buffer unit structure. The structure of the buffer unit in any existing shift registers falls within the scope of the present disclosure. The buffer unit in the shift register is not specifically defined herein.

Figure 4:
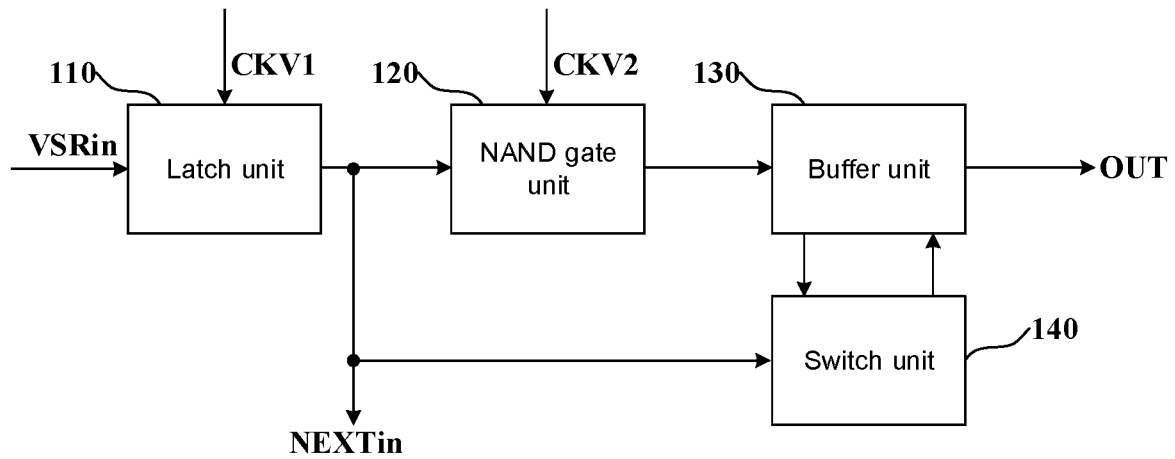
FIG. 4 is a block diagram illustrating a shift register according to another embodiment of the present disclosure.

FIG. 4 is a block diagram illustrating a shift register according to another embodiment of the present disclosure.

Apparently, the structure of the shift register provided by the present embodiment differs from that of the shift registers provided by any one of the above embodiments in that the switch unit 140 of the shift register provided by the present embodiment is configured to, under the control of the latch unit 110, connect or disconnect the output path of the buffer unit 130. Specifically, in the present embodiment, the input terminal and the output terminal of the switch unit 140 are both electrically connected to the buffer unit 130, and the switch unit 140 is configured to control the output path of the buffer unit 130 to be connected or disconnected. When the switch unit 140 is controlled to be turned on by the latch unit 110, the switch unit 140 enables the output path of the buffer unit 130 to be connected, so the shift register can transmit the scanning driving signal and the scanning stopping signal to the scanning line electrically connected to the shift register. When the switch unit 140 is controlled to be turned off by the latch unit 110, the switch unit 140 enables the output path of the buffer unit 130 to be disconnected, so the output terminal OUT of the shift register floats and the scanning line electrically connected to the shift register is in the floating state.

When applied to a display panel, the shift register of the present embodiment is electrically connected to a corresponding scanning line which is configured to control the pixel switches of a line of pixels to be turned on or off. Based on this, in the present embodiment, the work timing sequence of the shift register within one frame of time may be divided into three periods. The operation processes of the shift register in the first, second and third periods are the same as that of the shift register provided in the above embodiments and are not described herein.

According to the present embodiment, since the voltage of the pixel electrode drops only in the second period, the voltage of the pixel switch drops slightly within one frame of time. Accordingly, the brightness of the pixel electrode changes slightly within one frame of time. Based on this, the shift register provided by the present embodiment reduces the leakage current and reduces flickers on the display panel. When the drive frequency of the display panel is decreased, serious flickers will not occur because the voltage of the pixel electrode drops slightly within one frame of time and the brightness decreases slightly. That is, the present embodiment solves the serious flicker problem caused by decreasing the drive frequency of the display panel.

Figure 5A:
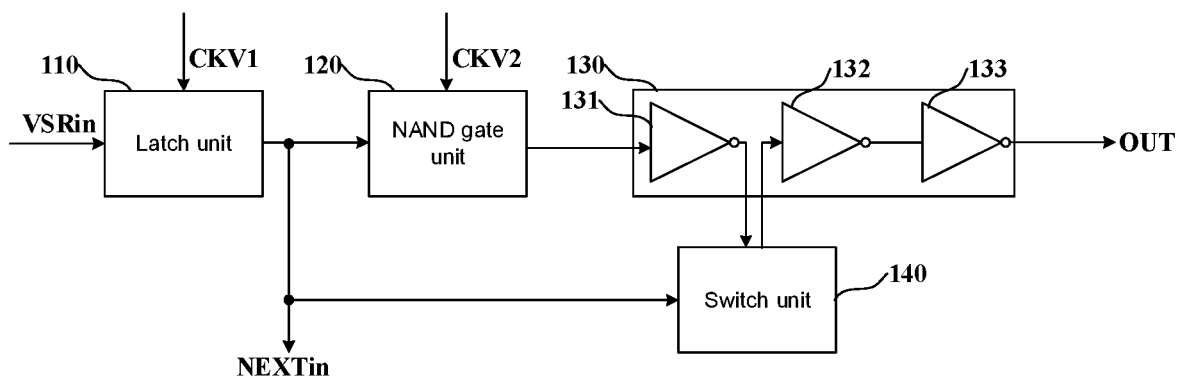
FIG. 5A to 5C are block diagrams illustrating three types of shift registers according to another embodiment of the present disclosure.

Exemplarily, an embodiment of the present disclosure further provides a shift register on the basis of the above-mentioned technical solution. As illustrated in FIG. 5A, the buffer unit 130 in the shift register includes a first inverter 131, a second inverter 132 and a third inverter 13. The input terminal of the first inverter 131 is electrically connected to the output terminal of the NAND gate unit 120, and the output terminal of the first inverter 131 is electrically connected to the input terminal of the switch unit 140. The input terminal of the second inverter 132 is electrically connected to the output terminal of the switch unit 140, and the output terminal of the second inverter 132 is electrically connected to the input terminal of the third inverter 133. The output terminal of the third inverter 133 is served as the output terminal OUT of the shift register.

Figure 5B:
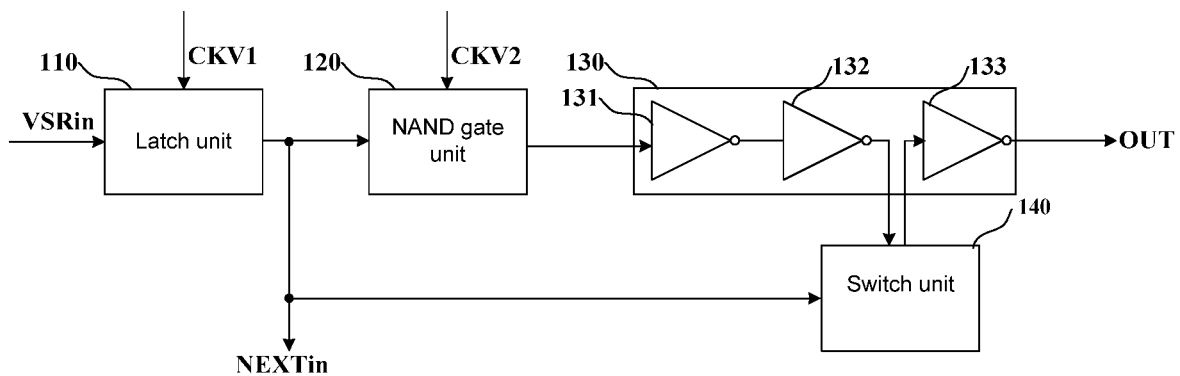

Exemplarily, an embodiment of the present disclosure further provides another shift register on the basis of the above-mentioned technical solution. As illustrated in FIG. 5B, the buffer unit 130 in the shift register includes a first inverter 131, a second inverter 132 and a third inverter 133. The input terminal of the first inverter 131 is electrically connected to the output terminal of the NAND gate unit 120, and the output terminal of the first inverter 131 is electrically connected to the input terminal of the second inverter 132. The output terminal of the second inverter 132 is electrically connected to the input terminal of the switch unit 140. The input terminal of the third inverter 133 is electrically connected to the output terminal of the switch unit 140. The output terminal of the third inverter 133 is served as the output terminal OUT of the shift register.

Figure 5C:
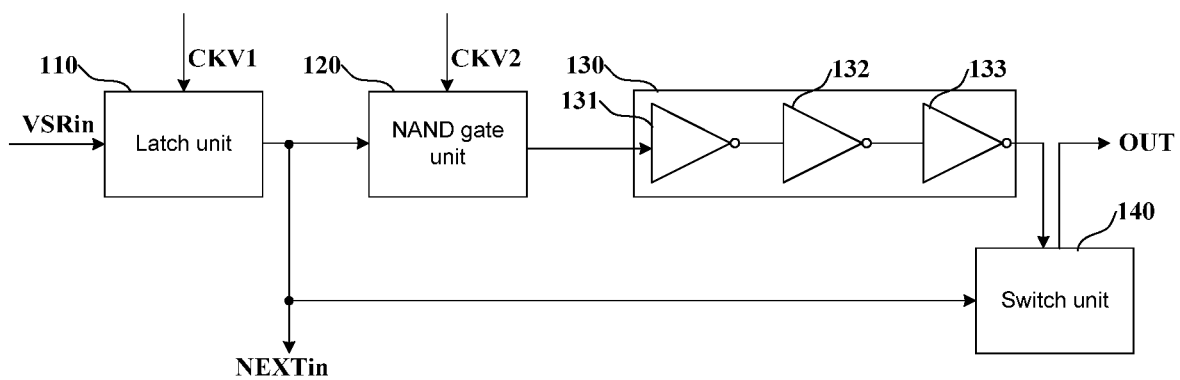

Exemplarily, an embodiment of the present disclosure further provides yet another shift register on the basis of the above-mentioned technical solution. As illustrated in FIG. 5C, the output terminal of the buffer unit 130 in the shift register is electrically connected to the output terminal OUT of the shift register via the switch unit 140. Specifically, the output terminal of the buffer unit 130 is electrically connected to the input terminal of the switch unit 140, and the output terminal of the switch unit 140 is served as the output terminal OUT of the shift register. Optionally, the buffer unit 130 includes a first inverter 131, a second inverter 132 and a third inverter 133. The input terminal of the first inverter 131 is electrically connected to the output terminal of the NAND gate unit 120, and the output terminal of the first inverter 131 is electrically connected to the input terminal of the second inverter 132. The input terminal of the third inverter 133 is electrically connected to the output terminal of the second inverter 132, and the output terminal of the third inverter 133 is electrically connected to the input terminal of the switch unit 140.

For any one of the three types of shift registers illustrated in FIG. 5A to FIG. 5C, in the third period, the output terminal OUT of the shift register floats so that the gate of the pixel switch floats. Therefore, no leakage current exists in the drain of the pixel switch and the voltage of the pixel electrode will not drop. As a result, the voltage of the pixel switch drops slightly within one frame of time. Accordingly, the brightness of the pixel electrode changes slightly within one frame of time. Based on this, various shift registers provided by the present embodiments reduce the leakage current and reduce flickers on the display panel. When the drive frequency of the display panel is decreased, serious flickers will not occur because the voltage of the pixel electrode drops slightly within one frame of time and the brightness decreases slightly. That is, the present embodiments solve the serious flicker problem caused by decreasing the drive frequency of the display panel.

It will be understood by those skilled in the art that the structure of the buffer unit in the shift register provided by any one of the present embodiments includes, but is not limited to, the above-mentioned buffer unit structure. The structure of the buffer unit in any existing shift registers falls within the scope of the present disclosure. The buffer unit of the shift register is not specifically defined herein.

Figure 6A:
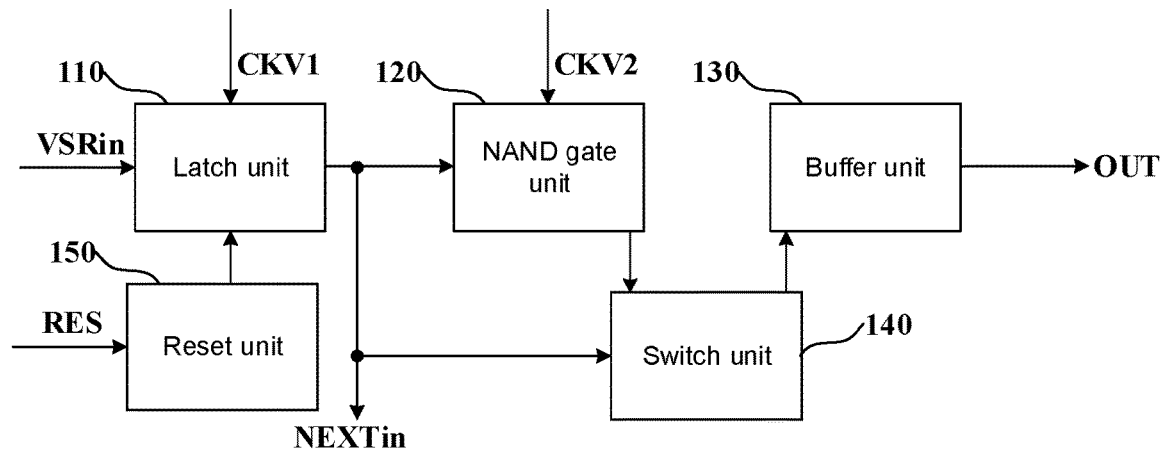
FIG. 6A is a block diagram illustrating a shift register according to yet another embodiment of the present disclosure.
Figure 6B:
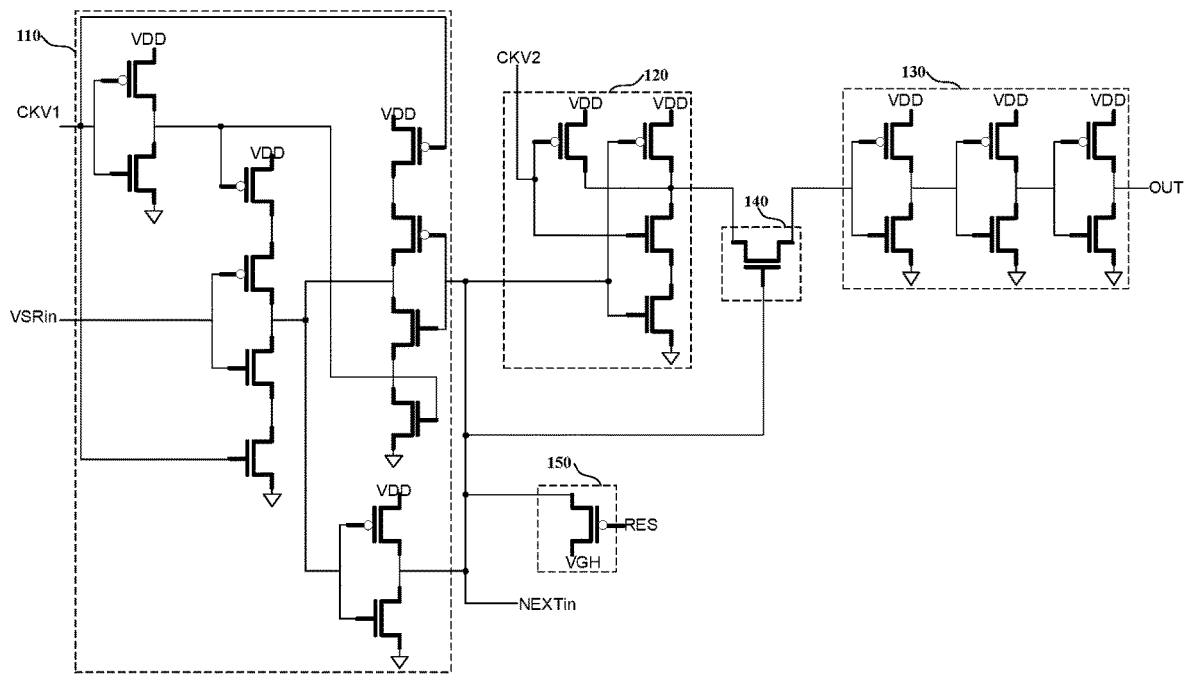
FIG. 6B is a structure circuit diagram of the shift register according to yet another embodiment of the present disclosure.

On the basis of any one of the above-mentioned embodiments, another embodiment of the present disclosure further provides a shift register illustrated in FIG. 6A. The shift register illustrated in FIG. 6A differs from the shift register described in any one of the above-mentioned embodiments in that the shift register further includes a reset unit 150. The input terminal of the reset unit 150 is electrically connected to a reset signal line RES. The output terminal of the reset unit 150 is electrically connected to the reset terminal of the latch unit 110. The reset unit 150 is configured to reset the shift register. Optionally, the structure of the reset unit 150 provided by the present embodiment is illustrated in FIG. 6B. Optionally, the shift register illustrated in FIG. 6A is based on the shift register illustrated in FIG. 2A, and the shift register illustrated in FIG. 6B is based on the shift register illustrated in FIG. 2D. It will be understood by those skilled in the art that the reset unit 150 illustrated in FIG. 6B is merely an exemplary structure and does not constitute a limitation on the specific structure of the reset unit 150 in the shift register.

Figure 7A:
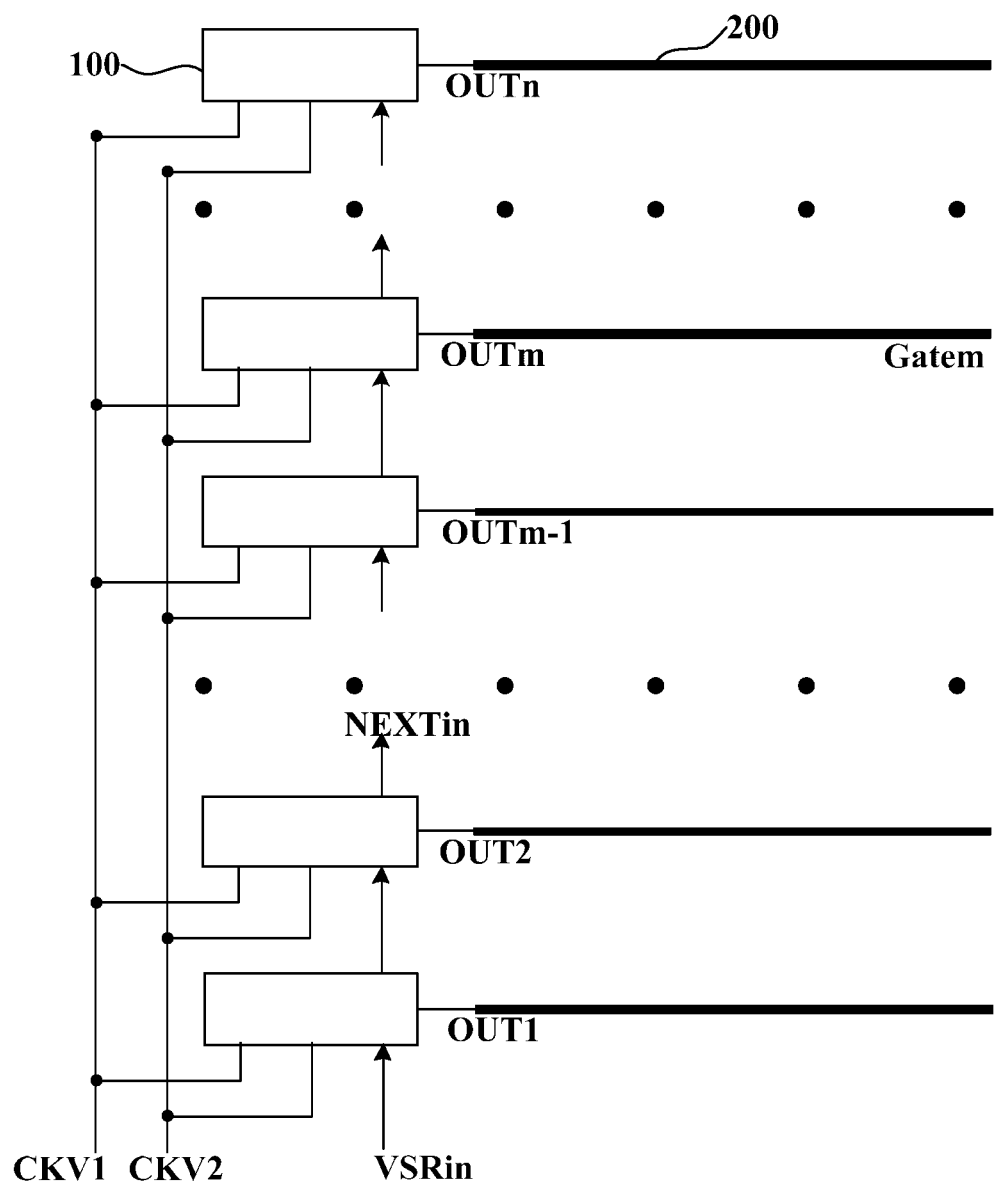
FIG. 7A is a schematic diagram illustrating a gate drive circuit according to yet another embodiment of the present disclosure.

Yet another embodiment of the present disclosure provides a gate drive circuit. As illustrated in FIG. 7A, the gate drive circuit includes n-level cascaded shift registers 100 as described in any one of the above embodiments and n scanning lines 200, where n is a positive integer. The input terminal of the latch unit in the mth-level shift register 100 is electrically connected to the output terminal of the latch unit in the (m−1)th-level shift register 100, where m=1, 2, . . . , n. The input terminal of the latch unit of the first-level shift register 100 receives a start signal when m=1. The output terminal OUTm of the mth-level shift register 100 is electrically connected to the mth scanning line 200. The output terminal OUTm is controlled to apply the scanning driving signal to the mth scanning line 200 in the first period, apply the scanning stopping signal to the mth scanning line 200 in the second period, and enable the output terminal OUT to float in the third period so that the electric potential of the mth scanning line 200 floats.

Optionally, the gate drive circuit of the present embodiment scans the n scanning lines 200 through progressive scanning. Specifically, the first-level shift register 100 is electrically connected to a shift register signal output terminal, a first clock signal output terminal and a second clock signal output terminal of a driver chip (not illustrated) respectively to receive the shift register signal VSRin, the first clock signal CKV1 and the second clock signal CKV2, thereby producing a secondary shift register signal and transmitting the secondary shift register signal to the input terminal NEXTin of the second-level shift register 100. Moreover, the first-level shift register is further configured to produce a scanning driving signal and transmit the scanning driving signal to the first scanning line 200 in the first period, produce a scanning stopping signal and transmit the scanning stopping signal to the first scanning line 200 in the second period, and control the output terminal OUT1 to float in the third period.

Figure 7B:
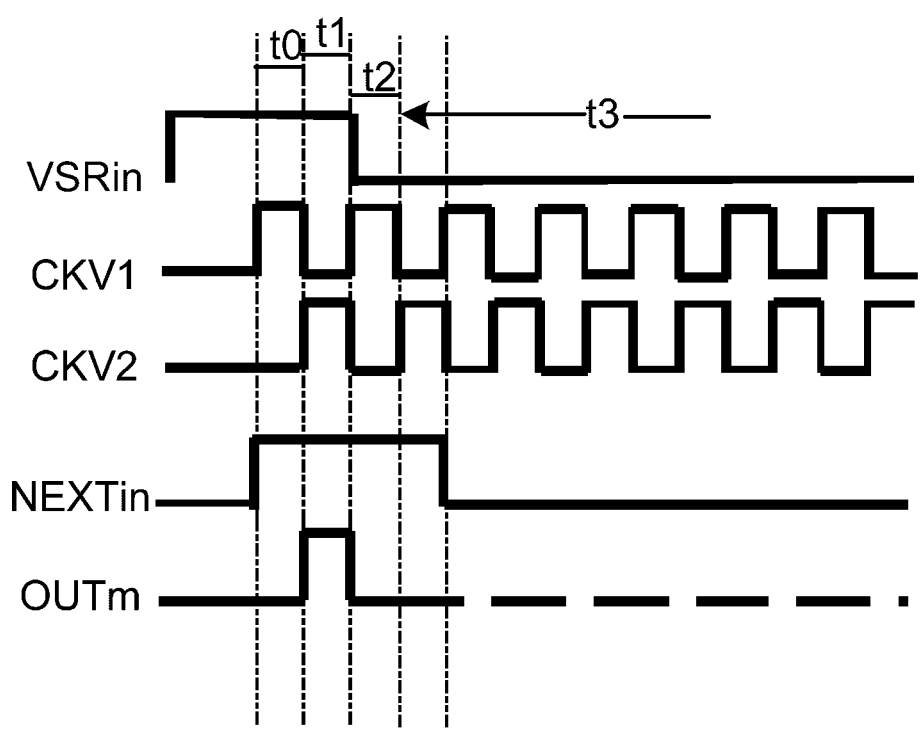
FIG. 7B illustrates a driving timing sequence of the gate drive circuit illustrated in FIG. 7A.

FIG. 7B is a timing sequence diagram of the mth-level shift register in the gate drive circuit illustrated in FIG. 7A. The timing sequence of one of the shift registers 100 (i.e., the mth-level shift register) in the gate drive circuit will be described below in connection with FIG. 2D, FIG. 7A and FIG. 7B. The mth shift register 100 is used for driving the mth scanning line Gatem. The input terminal of the mth-level shift register 100 receives the shift register signal VSRin transmitted from the (m−1)th-level shift register 100. The first clock signal terminal of the mth-level shift register 100 receives the first clock signal CKV1 transmitted from the driver chip. The second clock signal terminal of the mth-level shift register 100 receives the second clock signal CKV2 transmitted from the driver chip. The work timing sequence of the mth-level shift register 100 is as follows:

In t0 period, VSRin and CKV1 are high-level signals, and CKV2 is a low-level signal. In this case, a high-level signal is produced by the latch unit of the mth-level shift register 100 and transmitted to the input terminal NEXTin of the (m+1)th-level shift register 100. Meanwhile, the switch unit is controlled to be turned on via such high-level signal. Therefore, a high-level signal output from the NAND gate unit is transmitted to the buffer unit via the switch unit in the on-state, and then the output terminal of the buffer unit, i.e., the output terminal OUTm of the mth-level shift register 100, applies a low-level signal to the mth scanning line Gatem to control the pixel switches in a line of pixels corresponding to the mth scanning line Gatem to be turned off.

In t1 period, i.e., the first period, VSRin and CKV2 are high-level signals and CKV1 is a low-level signal. In this case, the latch unit of the mth-level shift register 100 continues outputting a high-level signal. Accordingly, the switch unit remains the on-state. A low-level signal is output from the NAND gate unit and transmitted to the buffer unit via the switch unit in the on-state. The output terminal of the buffer unit, i.e., the output terminal OUTm of the mth-level shift register 100, applies a high-level signal, i.e., the scanning driving signal, to the mth scanning line Gatem, so as to control the pixel switches of a line of pixels corresponding to the mth scanning line Gatem to be turned on, and charge the pixel electrodes of this line of pixels by the data line.

In t2 period, i.e., the second period, VSRin and CKV2 are low-level signals and CKV1 is a high-level signal. In this case, the latch unit of the mth-level shift register 100 continues outputting a high-level signal. Accordingly, the switch unit remains the on-state. A high-level signal output from the NAND gate unit is transmitted to the buffer unit via the switch unit in the on-state. The output terminal of the buffer unit, i.e., the output terminal OUTm of the mth-level shift register 100, applies a low-level signal, i.e., the scanning stopping signal, to the mth scanning line Gatem, so as to control the pixel switches of the line of pixels corresponding to the mth scanning line Gatem to be turned off. Therefore, the data line stops charging the pixel electrodes of this line of pixels. In this period, a leakage current exists in the pixel switches, resulting in a drop in the voltages of the pixel electrodes.

After the t2 period, i.e., in the third period t3, the latch unit of the mth-level shift register 100 outputs a low-level signal. Accordingly, the switch unit is controlled to be turned off. The output terminal OUTm of the mth-level shift register 100 floats, and thus the mth scanning line Gatem is in the floating state. Therefore, the gates of the pixel switches of the line of pixels corresponding to the mth scanning line Gatem float. In this period, no leakage current exists in the pixel switches, and thus the voltages of the pixel electrodes will not drop.

Figure 8A:
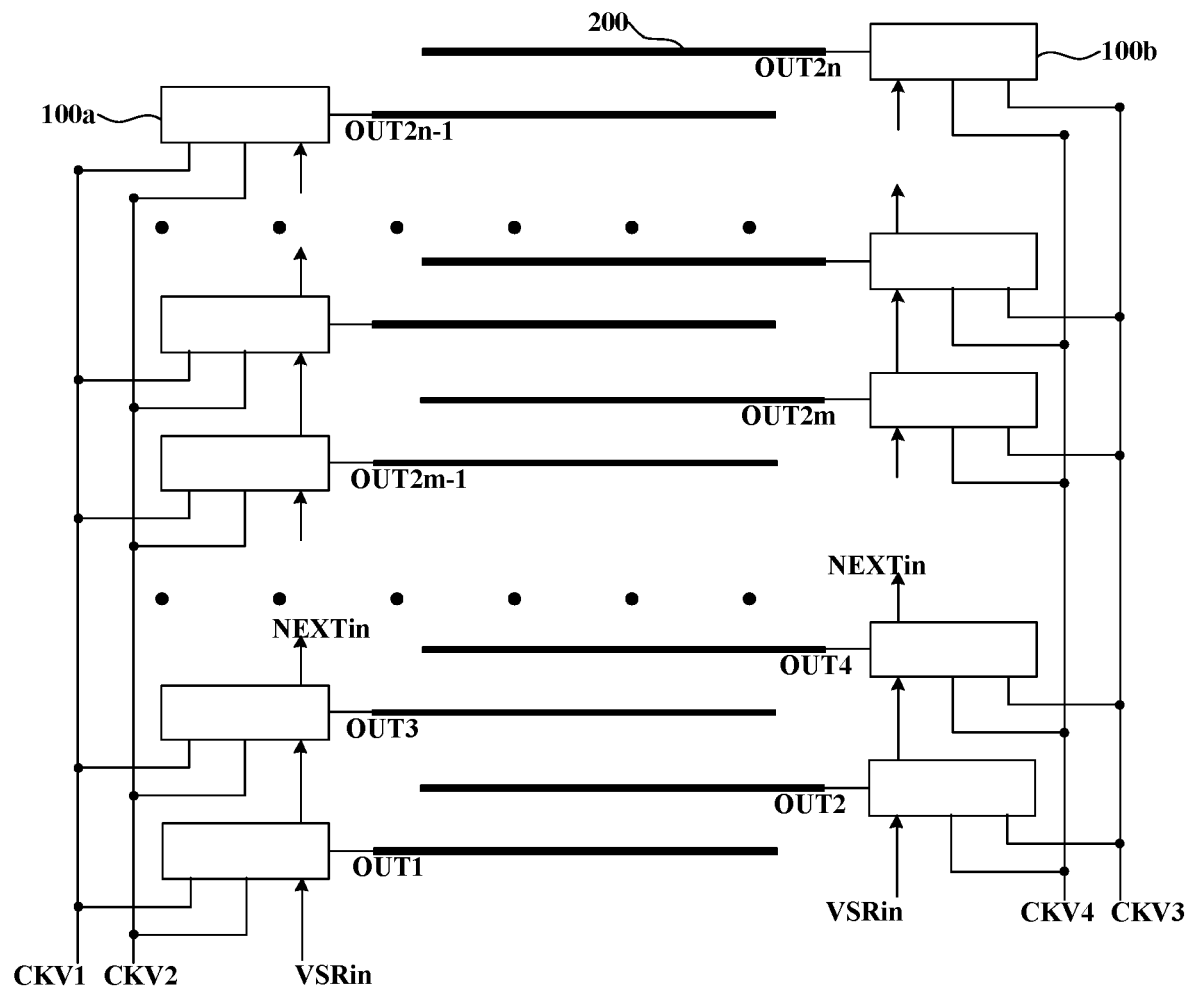
FIG. 8A is a schematic diagram illustrating another gate drive circuit according to yet another embodiment of the present disclosure.

Yet another embodiment of the present disclosure provides another gate drive circuit. As illustrated in FIG. 8A, the gate drive circuit includes n-level cascaded first shift registers 100*a* as described in any one of the above embodiments, n-level cascaded second shift registers 100*b* as described in any one of the above embodiments and 2n scanning lines 200, where n is a positive integer. The input terminal of the latch unit of the mth-level first shift register 100*a* is electrically connected to the output terminal of the latch unit of the (m−1)th-level first shift register 100*a*, where m=1, 2, . . . , n. The input terminal of the latch unit of the first-level shift register 100*a* receives a first start signal when m=1. The output terminal OUT of the mth-level first shift register 100*a* is electrically connected to the (2m−1)th scanning line 200, and is configured to apply the scanning driving signal to the (2m−1)th scanning line 200 in the first period, apply the scanning stopping signal to the (2m−1)th scanning line 200 in the second period, and float in the third period so that the electric potential of the (2m−1)th scanning line 200 floats. The input terminal of the latch unit of the mth-level second shift register 100*b* is electrically connected to the output terminal of the latch unit of the (m−1)th-level second shift register 100*b*, where m=1, 2, . . . , n. The input terminal of the latch unit of the first-level second shift register 100*b* receives a second start signal when m=1. The output terminal OUT of the mth-level second shift register 100b is electrically connected to the 2m-th scanning line 200, and is configured to apply the scanning driving signal to the 2m-th scanning line 200 in the first period, apply the scanning stopping signal to the 2m-th scanning line 200 in the second period, and float in the third period so that the electric potential of the 2m-th scanning line 200 floats.

Optionally, the gate drive circuit of the present embodiment scans the 2n scanning lines 200 through progressive scanning. Specifically, each of the n-level cascaded first shift registers 100a is electrically connected to a respective one of n odd-numbered lines among the 2n scanning lines 200, and each of the n-level cascaded second shift registers 100b is electrically connected to a respective one of n even-numbered lines among the 2n scanning lines 200. Specifically, the mth-level first shift register 100a is electrically connected to the (2m−1)th scanning line 200, and the mth-level second shift register 100b is electrically connected to the 2m-th scanning line 200. The first-level first shift register 100a is electrically connected to the shift register signal output terminal, the first clock signal output terminal and the second clock signal output terminal of the driver chip (not illustrated) separately to receive the shift register signal VSRina, the first clock signal CKV1 and the second clock signal CKV2. The first-level second shift register 100b is electrically connected to the shift register signal output terminal, a third clock signal output terminal and a fourth clock signal output terminal of the driver chip (not illustrated) separately to receive a shift register signal VSRinb, a third clock signal CKV3 and a fourth clock signal CKV4.

Figure 8B:
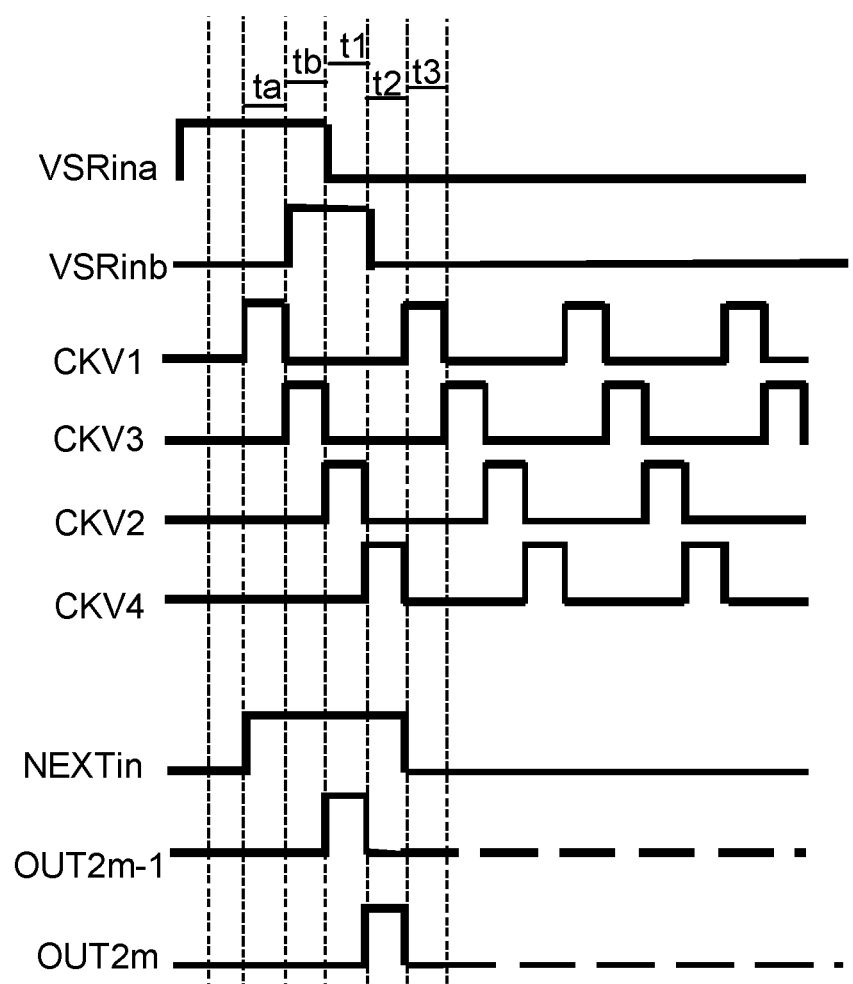
FIG. 8B illustrates a driving timing sequence of the gate drive circuit illustrated in FIG. 8A.

FIG. 8B is a timing sequence diagram of two shift registers corresponding to two adjacent scanning lines of the gate drive circuit illustrated in FIG. 8A. The timing sequence of two shift registers corresponding to two adjacent scanning lines of the gate drive circuit will be described below in connection with FIG. 2D. As an example, the work timing sequence of two shift registers corresponding to two adjacent scanning lines is described with respect to the mth-level first shift register 100a and the (2m−1)th scanning line 200 electrically connected to mth-level first shift register 100a, and the mth-level second shift register 100b and the 2m-th scanning line 200 electrically connected to the mth-level second shift register 100b, which is described below in detail.

The Mth-level First Shift Register

In to period, VSRina and CKV1 are high-level signals and CKV2 is a low-level signal. In this case, a high-level signal is produced by the latch unit of the mth-level first shift register 100a and transmitted to the input terminal NEXTin of the (m+1)th-level first shift register 100a. Meanwhile, the switch unit of the mth-level first shift register 100a is controlled to be turned on through the high-level signal produced by the latch unit of the mth-level first shift register 100a. A high-level signal output from the NAND gate unit of the mth-level first shift register 100a is transmitted to the buffer unit via the switch unit in the on-state. The output terminal of the buffer unit, i.e., the output terminal OUT2m−1 of the mth-level first shift register 100a, applies a low-level signal to the (2m−1)th scanning line Gate2m−1, so as to control the pixel switches of a line of pixels corresponding to the (2m−1)th scanning line Gate2m−1 to be turned off.

In tb period, VSRina is a high-level signal, and CKV1 and CKV2 are low-level signals. In this case, the latch unit of the mth-level first shift register 100a continues outputting a high-level signal. Accordingly, the switch unit remains the on-state. A high-level signal output from the NAND gate unit is transmitted to the buffer unit via the switch unit in the on-state. The output terminal of the buffer unit, i.e., the output terminal OUT2m−1 of the mth-level first shift register 100a, applies a low-level signal to the (2m−1)th scanning line Gate2m−1, so as to control the pixel switches of the line of pixels corresponding to the (2m−1)th scanning line Gate2m−1 to be turned off.

In t1 period, i.e., the first period of the mth-level first shift register, VSRina and CKV1 are low-level signals, and CKV2 is a high-level signal. In this case, the latch unit of the mth-level first shift register continues outputting a high-level signal. Accordingly, the switch unit remains the on-state. A low-level signal is output from the NAND gate unit and transmitted to the buffer unit via the switch unit. The output terminal of the buffer unit, i.e., the output terminal OUT2m−1 of the mth-level first shift register, applies a high-level signal, i.e., the scanning driving signal, to the (2m−1)th scanning line Gatem2m−1, so as to control the pixel switches of the line of pixels corresponding to the (2m−1)th scanning line Gatem2m−1 to be turned on, and charge the pixel electrodes of this line of pixels by the data line.

In t2 period, i.e., the second period of the mth-level first shift register, VSRina, CKV1 and CKV2 are low-level signals. In this case, the latch unit of the mth-level first shift register continues outputting a high-level signal. Accordingly, the switch unit remains the on-state. A high-level signal output from the NAND gate unit is transmitted to the buffer unit via the switch unit in the on-state. The output terminal of the buffer unit, i.e., the output terminal OUT2m−1 of the mth-level first shift register, applies a low-level signal, i.e., the scanning stopping signal, to the (2m−1)th scanning line Gate2m−1, so as to control the pixel switches of the line of pixels corresponding to the (2m−1)th scanning line Gate2m−1 to be turned off. Therefore, the data line stops charging the pixel electrodes of this line of pixels. In this period, a leakage current exists in the pixel switches, resulting in a drop in the voltages of the pixel electrodes.

After the t2 period, i.e., in the third period of the mth-level first shift register, the latch unit of the mth-level shift register outputs a low-level signal. Accordingly, the switch unit is controlled to be turned off, and the output terminal OUT2m−1 of the mth-level first shift register floats. Accordingly the (2m−1)th scanning line Gate2m−1 is in the floating state. Therefore, the gates of the pixel switches of the line of pixels corresponding to the (2m−1)th scanning line Gate2m−1 float. In this period, no leakage current exists in the pixel switches, and thus the voltages of the pixel electrodes will not drop.

The Mth-level Second Shift Register

In the tb period, VSRinb and CKV3 are high-level signals, and CKV4 is a low-level signal. In this case, a high-level signal is produced by the latch unit of the mth-level second shift register and transmitted to the input terminal NEXTin of the (m+1)th-level second shift register. Meanwhile, the switch unit is controlled to be turned on. A high-level signal output from the NAND gate unit is transmitted to the buffer unit via the switch unit in the on-state. The output terminal of the buffer unit, i.e., the output terminal OUT2m of the mth-level second shift register, applies a low-level signal to the 2m-th scanning line Gate2m, so as to control the pixel switches of a line of pixels corresponding to the 2m-th scanning line Gate2m to be turned off.

In the t1 period, VSRinb is a high-level signal, and CKV3 and CKV4 are low-level signals. In this case, the latch unit of the mth-level second shift register continues outputting a high-level signal. Accordingly, the switch unit remains the on-state. A high-level signal output from the NAND gate unit is transmitted to the buffer unit via the switch unit in the on-state. The output terminal of the buffer unit, i.e., the output terminal OUT2m of the mth-level second shift register, applies a low-level signal to the 2m-th scanning line Gate2m, so as to control the pixel switches in the line of pixels corresponding to the 2m-th scanning line Gate2m to be turned off.

In the t2 period, i.e., the first period of the mth-level second shift register, VSRinb and CKV3 are low-level signals, and CKV4 is a high-level signal. In this case, the latch unit of the mth-level second shift register continues outputting a high-level signal. Accordingly, the switch unit remains the on-state. A low-level signal is output from the NAND gate unit and transmitted to the buffer unit via the switch unit. The output terminal of the buffer unit, i.e., the output terminal OUT2m of the mth-level second shift register, applies a high-level signal, i.e., the scanning driving signal, to the 2m-th scanning line Gatem2m, so as to control the pixel switches of the line of pixels corresponding to the 2m-th scanning line Gatem2m to be turned on, and charge the pixel electrodes of this line of pixels through the data line.

In the t3 period, i.e., the second period of the mth-level second shift register, VSRinb, CKV3 and CKV4 are low-level signals. In this case, the latch unit of the mth-level second shift register continues outputting a high-level signal. Accordingly, the switch unit remains the on-state. A high-level signal output from the NAND gate unit is transmitted to the buffer unit via the switch unit in the on-state. The output terminal of the buffer unit, i.e., the output terminal OUT2m of the mth-level second shift register, applies a low-level signal, i.e., the scanning stopping signal, to the 2m-th scanning line Gate2m, so as to control the pixel switches of the line of pixels corresponding to the 2m-th scanning line Gate2m to be turned off. Therefore, the data line stops charging the pixel electrodes of this line of pixels. In this period, a leakage current exists in the pixel switches, resulting in a drop in the voltages of the pixel electrodes.

After the t3 period, i.e., in the third period of the mth-level second shift register, the latch unit of the mth-level second shift register outputs a low-level signal. Accordingly, the switch unit is controlled to be turned off. The output terminal OUT2m of the mth-level second shift register floats, and thus the 2m-th scanning line Gate2m is in the floating state. Therefore, the gates of the pixel switches of the line of pixels corresponding to the 2m-th scanning line Gate2m float. In this period, no leakage current exists in the pixel switches, and thus the voltages of the pixel electrodes will not drop.

In summary, in the shift register provided by the present embodiment, VSRina and VSRinb signals are used to control the control terminal of the switch unit. In the first period, CKV2/CKV4 is a high-level signal, and the switch unit is turned on, ensuring that the scanning line is normally turned on. In the second period, CKV2/CKV4 is a low-level signal, and the switch unit remains the on-state so that the scanning line is turned off. In the third period, the scanning line is switched to the floating state.

According to the gate drive circuit provided by the present disclosure, the gates are not affected by data line coupling when being in the floating state, so that no voltage jump occurs in the scanning line. That is, the output waveform on the scanning line does not jump. Moreover, according to the gate drive circuit provided by the present disclosure, the voltage holding abilities of the pixel electrodes are improved within one frame of time since the switch unit is added to the shift register.

The shift register provided by the present embodiment controls the output terminal OUT thereof to float in the third period, thereby effectively reducing the leakage current of the pixel switches of a line of pixels corresponding to the shift register and thus improving the display effect of the display panel. It is to be noted that in the gate drive circuit described in the present embodiment, the scanning line can be either driven at one side as illustrated in FIG. 7A or cross-driven at two sides as illustrated in FIG. 8A. The methods for driving the scanning line are not limited in the present disclosure.

Figure 9:
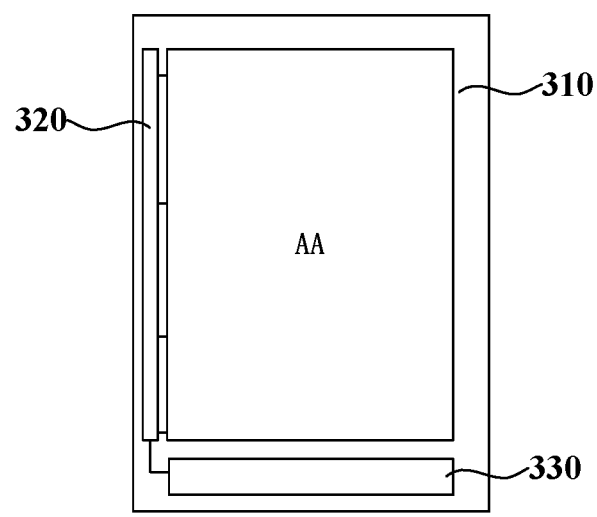
FIG. 9 is a top view of an array substrate according to an embodiment of the present disclosure.

An embodiment of the present disclosure further provides an array substrate including the gate drive circuit described in any one of the above embodiments. As illustrated in FIG. 9, the array substrate includes a display area AA, a non-display area 310 surrounding the display area AA, a gate drive circuit 320 disposed in the non-display area 310 and a driver chip 330 electrically connected to the gate drive circuit 320. It will be understood by those skilled in the art that the structure of the array substrate includes, but is not limited to, the structure illustrated herein. The array substrate may further include a TFT array, a data line, a source drive circuit, a driver chip and the like. Only the gate drive circuit and its position on the array substrate are specifically illustrated herein. The structure of the array substrate is not specifically defined herein.

Figure 10:
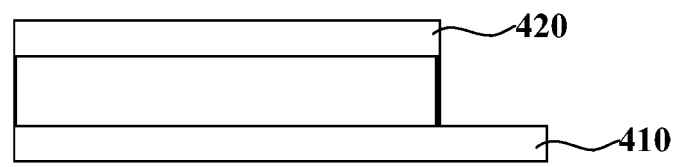
FIG. 10 is a schematic cross sectional view a display panel according to an embodiment of the present disclosure.

An embodiment of the present disclosure further provides a display panel including the array substrate described above. As illustrated in FIG. 10, the display panel includes an array substrate 410 and a color filter substrate 420 which are oppositely disposed. A light-emitting functional layer is interposed between the array substrate 410 and the color filter substrate 420. In the present embodiment, the display panel is optionally a liquid crystal display panel. In other alternative embodiments, the display panel may also be optionally an organic light emitting display panel. It will be understood by those skilled in the art that the display panel is not particularly limited in the present disclosure and any of the existing display panels adopting a shift register falls within the scope of the present disclosure.

Optionally, the drive frequency of the display panel in the present embodiment is 30 Hz or 15 Hz. Specifically, a switch unit is added to the shift register of the gate drive circuit of the display panel. Therefore, the scanning line is controlled to turn on the pixel switches to charge the pixel electrodes of the corresponding line of pixels in the first period, i.e., the pixel charging period; the scanning line is controlled to turn off the pixel switches in the second period, i.e., the pixel holding period, so as to hold the voltages of the pixel electrodes; and the scanning line is controlled to to float in the third period, i.e., the pixel holding period, so that the gates of the pixel switches float. This prevents the drains of the pixel switches from discharging via capacitance formed between the gates and the channels, effectively prevents the pixel voltages from dropping and improves the voltage holding ability. Even if the drive frequency is 30 Hz or 15 Hz, the display panel still has no serious flickers.

For any one of the shift registers in the gate drive circuit of the display panel, in the mth frame of picture, the third period is a period from the end time of the second period for the shift register to the start time of the first period of the next frame of picture. The second period and the third period are both voltage holding periods of the pixel electrodes. So a combination of the second period and the third period is referred to as the pixel holding period. In the related art, the voltages of the pixel electrodes drop continuously in the pixel holding period due to the continuous leakage current in the pixel switches. In contrast, in the display panel provided by the present embodiment, the voltages of the pixel electrodes drop in the second period of the pixel holding period due to the leakage current, and no leakage current exists in the third period of the pixel holding period. Therefore, compared with the related art, even driven by a low frequency, the display panel of the present embodiment has a better display effect and reduces the existing serious flickers.

The gate drive circuit of the present embodiment can effectively reduce the leakage current by using the shift register described in any one of the above embodiments. When using a lower drive frequency, the display panel provided by the present embodiment can effectively solve the serious flicker problem on the display panel running at the lower frequency. The display panel provided by the present embodiment can achieve a narrow bezel while ensuring the charging capacity.

It is to be noted that the above are only preferred embodiments of the present disclosure and the technical principles used therein. It will be understood by those skilled in the art that the present disclosure is not limited to the specific embodiments described herein. Those skilled in the art can make various apparent changes, modifications and substitutions without departing from the scope of the present disclosure. Therefore, while the present disclosure has been described in detail via the above-mentioned embodiments, the present disclosure is not limited to the above-mentioned embodiments and may include more other equivalent embodiments without departing from the concept of the present disclosure. The scope of the present disclosure is determined by the scope of the appended claims.

What is claimed is:

1. A shift register, comprising:
   a latch unit, a NAND gate unit and a buffer unit;
   wherein the latch unit has an input terminal for receiving a shift register signal, a clock signal terminal electrically connected to a first clock signal line, and an output terminal electrically connected to an input terminal of the NAND gate unit and an input terminal of a lower-level shift register separately;
   wherein the NAND gate unit has a clock signal terminal electrically connected to a second clock signal line, and an output terminal electrically connected to an input terminal of the buffer unit; an output terminal of the buffer unit is electrically connected to an output terminal of the shift register, wherein the latch unit, the NAND gate unit and the buffer unit are configured to produce a scanning driving signal and a scanning stopping signal;
   wherein the shift register further comprises a switch unit and the output terminal of the latch unit is further electrically connected to a control terminal of the switch unit;
   wherein the latch unit is configured to perform one of the following operations: controlling the switch unit to be turned on to output the scanning driving signal or the scanning stopping signal from the output terminal of the shift register, and controlling the switch unit to be turned off to enable the output terminal of the shift register to float;
   wherein in a first period, the switch unit is turned on to output the scanning driving signal from the shift register;
   wherein in a second period, the switch unit is turned on to output the scanning stopping signal from the shift register; and
   wherein in a third period, the switch unit is turned off to enable the output terminal of the shift register to float.

2. The shift register according to claim 1, wherein the output terminal of the NAND gate unit is electrically connected to the input terminal of the buffer unit via the switch unit, wherein the output terminal of the NAND gate unit is electrically connected to an input terminal of the switch unit, and the input terminal of the buffer unit is electrically connected to an output terminal of the switch unit.

3. The shift register according to claim 2, wherein the buffer unit comprises: a first inverter, a second inverter and a third inverter,
   wherein the first inverter has an input terminal electrically connected to the output terminal of the switch unit, and an output terminal electrically connected to an input terminal of the second inverter; and
   wherein the third inverter has an input terminal electrically connected to an output terminal of the second inverter, and an output terminal served as the output terminal of the shift register.

4. The shift register according to claim 1, wherein the buffer unit comprises: a first inverter, a second inverter and a third inverter,
   wherein the first inverter has an input terminal electrically connected to the output terminal of the NAND gate unit, and an output terminal electrically connected to an input terminal of the switch unit;
   wherein the second inverter has an input terminal electrically connected to an output terminal of the switch unit, and an output terminal electrically connected to an input terminal of the third inverter; and
   wherein an output terminal of the third inverter is served as the output terminal of the shift register.

5. The shift register according to claim 1, wherein the buffer unit comprises: a first inverter, a second inverter and a third inverter,
   wherein the first inverter has an input terminal electrically connected to the output terminal of the NAND gate unit, and an output terminal electrically connected to an input terminal of the second inverter;
   wherein an output terminal of the second inverter is electrically connected to an input terminal of the switch unit; and
   wherein the third inverter has an input terminal electrically connected to an output terminal of the switch unit, and an output terminal served as the output terminal of the shift register.

6. A shift register, comprising:
   a latch unit, a NAND gate unit, a buffer unit and a switch unit;
   wherein the latch unit has an input terminal for receiving a shift register signal, a clock signal terminal electrically connected to a first clock signal line, and an output terminal electrically connected to an input terminal of the NAND gate unit and an input terminal of a lower-level shift register separately;
   wherein the NAND gate unit has a clock signal terminal electrically connected to a second clock signal line, and an output terminal electrically connected to an input terminal of the buffer unit;
   wherein the output terminal of the latch unit is further electrically connected to a control terminal of the switch unit, the output terminal of the buffer unit is electrically connected to the output terminal of the shift register via the switch unit, wherein the output terminal of the buffer unit is electrically connected to an input terminal of the switch unit, and an output terminal of the switch unit is served as the output terminal of the shift register;

wherein the latch unit, the NAND gate unit and the buffer unit are configured to produce a scanning driving signal and a scanning stopping signal;

wherein the latch unit is configured to perform one of the following operations: controlling the switch unit to be turned on to output the scanning driving signal or the scanning stopping signal from the output terminal of the shift register, and controlling the switch unit to be turned off to enable the output terminal of the shift register to float;

wherein in a first period, the switch unit is turned on to output the scanning driving signal from the shift register;

wherein in a second period, the switch unit is turned on to output the scanning stopping signal from the shift register; and wherein in a third period, the switch unit is turned off to enable the output terminal of the shift register to float.

7. The shift register according to claim 6, wherein the buffer unit comprises: a first inverter, a second inverter and a third inverter, wherein the first inverter has an input terminal electrically connected to the output terminal of the NAND gate unit, and an output terminal electrically connected to an input terminal of the second inverter; and wherein the third inverter has an input terminal electrically connected to an output terminal of the second inverter, and an output terminal electrically connected to the input terminal of the switch unit.

8. The shift register according to claim 1, further comprising: a reset unit, wherein the reset unit has an input terminal electrically connected to a reset signal line and an output terminal electrically connected to a reset terminal of the latch unit.

9. The shift register according to claim 1, wherein the switch unit comprises: a first NMOS transistor, wherein a gate of the first NMOS transistor is electrically connected to the output terminal of the latch unit, and wherein the first NMOS transistor has a double-gate structure.

10. The shift register according to claim 9, wherein a width-to-length ratio W/L of the first NMOS transistor is in a range of 2.5 to 7.5.

11. The shift register according to claim 9, wherein a width of the first NMOS transistor is in a range of 20 μm to 60 μm.

12. A gate drive circuit comprising n-level cascaded shift registers and n scanning lines, wherein n is a positive integer, and each one of the n-level cascaded shift registers comprises:

a latch unit, a NAND gate unit and a buffer unit, wherein the latch unit has an input terminal for receiving a shift register signal, a clock signal terminal electrically connected to a first clock signal line, and an output terminal electrically connected to an input terminal of the NAND gate unit and an input terminal of a lower-level shift register separately;

wherein the NAND gate unit has a clock signal terminal electrically connected to a second clock signal line, and an output terminal electrically connected to an input terminal of the buffer unit;

wherein an output terminal of the buffer unit is electrically connected to an output terminal of the shift register, wherein the latch unit, the NAND gate unit and the buffer unit are configured to produce a scanning driving signal and a scanning stopping signal;

wherein the shift register further comprises a switch unit, the output terminal of the latch unit is further electrically connected to a control terminal of the switch unit, wherein the latch unit is configured to perform one of the following operations: controlling the switch unit to be turned on so as to output the scanning driving signal or the scanning stopping signal from the output terminal of the shift register, and controlling the switch unit to be turned off so as to enable the output terminal of the shift register to float;

wherein in a first period, the switch unit is turned on so as to output the scanning driving signal from the shift register; in a second period, the switch unit is turned on so as to output the scanning stopping signal from the shift register; and in a third period, the switch unit is turned off so as to enable the output terminal of the shift register to float, wherein the input terminal of the latch unit in a mth-level shift register is electrically connected to the output terminal of the latch unit in a (m−1)th-level shift register, wherein m=1, 2, . . . , n, and the input terminal of the latch unit in a first-level shift register is configured to receive a start signal when m=1; and wherein the mth-level shift register is electrically connected to a mth scanning line, and is configured to apply the scanning driving signal to the mth scanning line in the first period, apply the scanning stopping signal to the mth scanning line in the second period, and control the output terminal of the shift register to float in the third period to enable an electric potential of the mth scanning line to float.

13. A display panel comprising a gate drive circuit of claim 12.

14. The display panel according to claim 13, wherein a drive frequency of the display panel is one of 30 Hz and 15 Hz.

* * * * *